United States Patent [19]
Brauch et al.

[11] Patent Number: 6,002,466
[45] Date of Patent: Dec. 14, 1999

[54] LITHOGRAPHY EXPOSURE DEVICE

[75] Inventors: Uwe Brauch, Stuttgart; Hans Opower, Krailling; Bernd Hoefflinger, Sindelfingen; Reinhard Springer, Renfrizhausen, all of Germany

[73] Assignees: Deutsches Zentrum fuer Luft -und Raumfahrt e.V., Bonn; Institutfuer Mikroelektronik Stuttgart, Stuttgart, both of Germany

[21] Appl. No.: 09/048,374

[22] Filed: Mar. 26, 1998

Related U.S. Application Data

[63] Continuation of application No. PCT/EP97/03053, Jun. 12, 1997.

[30] Foreign Application Priority Data

Jun. 29, 1996 [DE] Germany .............................. 196 26 176

[51] Int. Cl.⁶ ................................................... G03B 27/42
[52] U.S. Cl. .................................. 355/53; 355/67; 355/70
[58] Field of Search .................................. 355/46, 53, 70, 355/67; 430/311

[56] References Cited

U.S. PATENT DOCUMENTS

| | | |
|---|---|---|
| 4,393,387 | 7/1983 | Kitamura . |
| 4,541,712 | 9/1985 | Whitney ..................................... 355/53 |
| 4,577,926 | 3/1986 | Dewey et al. . |
| 4,947,186 | 8/1990 | Calloway et al. . |
| 5,091,744 | 2/1992 | Omata ....................................... 355/53 |
| 5,121,256 | 6/1992 | Corle et al. . |
| 5,339,737 | 8/1994 | Lewis et al. . |
| 5,343,271 | 8/1994 | Morishige . |

FOREIGN PATENT DOCUMENTS

| | | |
|---|---|---|
| 0467076 | 1/1992 | European Pat. Off. . |
| 0 655 707 | 5/1995 | European Pat. Off. . |
| 25 58 788 | 7/1976 | Germany . |
| 36 24 163 | 1/1987 | Germany . |
| 41 06 423 | 10/1991 | Germany . |
| 40 22 732 | 2/1992 | Germany . |
| 44 26 107 | 2/1995 | Germany . |
| 195 21 390 | 2/1996 | Germany . |
| WO 93/24326 | 12/1993 | WIPO . |

*Primary Examiner*—Alan A. Mathews
*Attorney, Agent, or Firm*—Barry R. Lipsitz; Ralph F. Hoppin

[57] ABSTRACT

A lithography exposure device allows more effective production of small structures within a short time by lithography. The device includes a retainer for a substrate, an exposure unit for producing a light spot on the light-sensitive layer of the substrate, a motion unit for producing apparent motion between the exposure unit and the retainer, and a control unit for controlling the intensity and position of the light spot on the light-sensitive layer. The exposure unit has several solid-state lasers, and a focusing unit that guides the laser beam of each solid-state laser to a light spot of a defined light spot pattern. The entire light spot pattern and the retainer are displaceable relative to each other in an exposure motional direction. Moreover, the light spots of the light spot pattern which correspond to the form of the partial areas to be exposed can be activated or deactivated.

19 Claims, 15 Drawing Sheets

LITHOGRAPHY EXPOSURE DEVICE

This application is a continuation of International PCT Application No. PCT/EP97/03053 filed on Jun. 12, 1997.

BACKGROUND OF THE INVENTION

The invention relates to a lithography exposure device, comprising a mounting device for a substrate provided with a layer sensitive to light, an exposure unit with a laser and an optical beam guidance means for generating a light spot on the light-sensitive layer of the substrate held in the mounting device, a movement unit for generating a relative movement between the optical beam guidance means of the exposure unit and the mounting device and a control for controlling the intensity and position of the light spot on the light-sensitive layer of the substrate.

Lithography exposure devices of this type are known from the state of the art.

The problem with these known lithography exposure devices consists in the fact that the complex circuit designs now customary in semiconductor technology are not projected onto the light-sensitive layer with the required speed and that, in addition, the known lithography exposure devices operating with lasers can be used only for the manufacture of masks but not directly for the manufacture of structures straight onto a semiconductor substrate for creating components since the structures which can be produced are not small enough. This disadvantage plays a lesser role in the production of masks since the masks have structures which, for their part, are reduced in size again by means of an optical imaging means during imaging onto the light-sensitive layer of a wafer.

SUMMARY OF THE INVENTION

The object underlying the invention is therefore to provide a lithography exposure device, with which structures which are as small as possible can be produced by means of lithography with great efficiency and in periods of time which come close to the order of magnitude of the production times customary today and obtainable with masks.

This object is accomplished in accordance with the invention, in a lithography exposure device of the type described at the outset, in that the exposure unit comprises a plurality of semiconductor lasers, that the optical beam guidance means guides the laser radiation of each semiconductor laser to a light spot of a defined light spot pattern and that the entire light spot pattern and the mounting device are movable relative to one another in an exposure movement direction and the light spots of the light spot pattern are thereby activatable and deactivatable in accordance with the shape of the sections to be exposed.

The advantage of the inventive solution is to be seen in the fact that as a result of the use of semiconductor lasers the possibility is created of making available in a simple, in particular, inexpensive way a plurality of laser units, of which each subsequently results in one light spot of the light spot pattern which, for its part, can be moved in an unchanged manner relative to the light spot pattern. In addition, the advantage exists in the case of the semiconductor lasers that these, on the one hand, exhibit an adequate initial power and, on the other hand, can be activated and deactivated quickly, preferably in the nanosecond range.

On account of the fact that the light spot pattern as such remains inflexible, a plurality of individually controllable semiconductor lasers is provided and these can be controlled quickly, it is possible to expose relatively large surface areas per unit of time in a precise manner and thus lend to the inventive solution a throughput capacity desired under technical production aspects.

In particular, the light spot pattern is maintained during the relative movement between this and the mounting device with the desired precision only when the optical beam guidance means forms an invariable unit which, as a whole, remains unchanged during the relative movement so that relative movement between the light spot pattern and the mounting device can be ensured only on the basis of relative movement between the optical imaging means and the mounting device.

The sections to be exposed can thus be produced with an adequately high speed and precision.

The light spot pattern can, in principle, have light spots arranged in any optional manner.

It is, however, particularly advantageous when the light spot pattern has light spots arranged at different distances in a transverse direction extending at right angles to the exposure movement direction proceeding from a light spot serving as reference so that when the relative movement is carried out in the exposure movement direction each light spot can be used for exposing different sections of the light-sensitive layer.

In this respect, it is particularly favorable when each light spot of the light spot pattern has a different distance from the light spot serving as reference than the remaining light spots so that with a predetermined number of light spots the greatest possible number of different sections of the light-sensitive layer can be exposed.

It is particularly expedient when the distances of all the light spots of the light spot pattern form a series of distances, with which each distance is greater by one increment than another one of the distances. This means that with the entirety of the light spot pattern each light spot has, on the one hand, a different distance and, on the other hand, all the different distances may be arranged in a row according to size, wherein the difference from one distance to the next corresponds to the increment.

In order to have as great a degree of freedom as possible relative to the size of the light spots during the production of the sections to be exposed, it is preferably provided for the increment to be smaller than an extension of the light spots in the transverse direction.

This means that in the light spot pattern altogether light spots are available in a distance raster with the increment as minimum distance and so the distance raster is considerably finer than the extension of the light spots in the transverse direction.

It is particularly expedient when the increment is at the most a quarter of the extension of the light spots in the transverse direction. It is even better when the increment is a tenth of the extension of the light spots in the transverse direction since it is then possible to produce the structures to be exposed in a finer writing raster (grid) with a light spot pattern.

A particularly advantageous embodiment provides for the light spot pattern to comprise at least one series of light spots which are arranged in a row and have a distance from one another at right angles to the exposure movement direction which is smaller than their extension at right angles to the exposure movement direction.

It is thus possible to carry out a lithographic exposure in the area within an extension of the series at right angles to the exposure movement direction with great precision.

Such a series of light spots may be produced particularly favorably since, when using semiconductor lasers, these are preferably utilized in rows as semiconductor laser arrays, wherein a distance predetermined by the semiconductor array exists between the individual semiconductor lasers. Imaging of such a semiconductor laser array into the light spot pattern with light spots which are as small as possible automatically leads to such a light spot pattern.

In this respect, it is preferably provided for the distance between the light spots of the series to be constant at right angles to the direction of movement. This allows a light spot pattern to be achieved which can be used in a particularly favorable manner.

In this case, each of the series of light spots arranged in a row preferably forms a row of light spots extending along a straight line.

A solution is particularly favorable, in which the light spots in the respective row have in series direction a distance from one another which is greater than their extension in series direction.

In order for the light spots to have as small a distance as possible from one another in the transverse direction extending at right angles to the exposure movement direction, this distance even being, where possible, smaller than the extension of the light spots in the transverse direction, it is preferably provided for the series direction to form an angle not equal to 90°—for example, smaller than 90°—with the exposure movement direction. The projection of the light spots arranged in the series onto the transverse direction extending at right angles to the exposure movement direction thus brings about a reduction in the distance to the extent specified in the foregoing.

In principle, semiconductor lasers, which generate laser radiation in the blue spectral range or in the close ultraviolet range, can be used with the inventive device. Since semiconductor lasers of this type do not so far have the price-to-power ratio required for commercial use, it is preferably provided for the exposure unit to comprise frequency doublers post-connected to the semiconductor lasers. In this case, it is possible to use conventional semiconductor lasers operating in the red or infrared spectral range and to double the frequency.

In conjunction with the preceding explanations concerning the individual embodiments, no details have been given as to how the laser radiation is intended to be guided from the semiconductor lasers to the optical beam guidance means since the optical beam guidance means and the mounting device must be movable relative to one another. For example, it would be conceivable—as already mentioned previously—to use the semiconductor laser arrangements or semiconductor laser arrays directly and proceeding from this system to image the individual laser beams onto the light-sensitive layer by means of the optical beam guidance means in order to generate the light spot pattern so that the semiconductor lasers and the optical beam guidance means form a unit and this unit and the mounting device are thereby movable relative to one another.

On account of the operating devices required for semiconductor laser units and necessitating considerable resources, this is, however, possible only to a limited extent in many cases. For this reason, it is advantageously provided for the exposure unit to comprise light guides which guide the laser radiation to the optical beam guidance means and open up the possibility of bringing the laser radiation to the optical beam guidance means from semiconductor lasers which are arranged further away with as little loss as possible so that, in this case, the optical beam guidance means and the mounting device form the units movable relative to one another.

Single mode fibers are preferably used for light guides of this type and as semiconductor lasers those which work in single mode operation.

The light guides are preferably designed such that they have a first end, into which the laser radiation can be coupled, and a second end, from which the laser radiation exits, and that a collimating element is arranged to follow each second end, this element collimating the laser radiation exiting divergently from each individual second end of the light guides and forming therefrom a collimated radiation bundle.

Such a solution has the great advantage that it is possible to image the collimated radiation bundle in an optimum manner onto the light-sensitive layer and thus to obtain as small a diameter of the resulting light spot as possible, wherein, in this case, the second ends and the optical beam guidance means comprising the collimating optical means preferably form a unit and this unit and the mounting device are movable relative to one another.

With respect to the design of the optical beam guidance means, no further details have so far been given. One advantageous embodiment, for example, provides for the optical beam guidance means to comprise a telescope imaging in a reducing manner. With such a telescope it is possible to advantageously image the laser radiation generated with the semiconductor lasers at large distances due to technology and with a view to the size of the light spots to be generated such that the distances between the light spots and the light spots themselves become smaller.

With a telescope of this type reductions of more than a factor of 10 may be achieved.

In order to be able to generate lithographic layers, in particular, directly for the immediate production of an integrated circuit, it is advantageously provided for the optical beam guidance means to comprise an optical microscope generating the light spots. Such an optical microscope forms a simple possibility of obtaining as great a reduction as possible in the distances between the individual light spots.

An optical microscope does, however, have the disadvantage that the extension of the light spots heavily depends on the distance of the optical microscope from the layer to be exposed. For this reason, it is advantageously provided for the optical microscope to be arranged on a height positioning device and to be positionable by this during the exposure movement at a defined distance above the light-sensitive layer. Such a height positioning device thus creates the possibility of eliminating the disadvantages of such an optical microscope or at least keeping them slight.

It is particularly expedient when a distance between an underside of the optical microscope facing the light-sensitive layer and the light-sensitive layer can be maintained as a result of the height positioning device.

In this respect, it is preferably provided for the distance to be in the order of magnitude of a diameter of the individual light spot on the light-sensitive layer.

With the optical microscope described thus far it is possible in a diffraction-limited manner to obtain light spots, the extension of which is in the order of magnitude of the wavelength of the laser radiation.

In order, however, to obtain a size of the individual light spots which is as defined as possible, particularly in the range of the wavelength of the laser light used or smaller, it is preferably provided for the optical microscope to be provided with a near-field optical means defining the size of the light spots on the light-sensitive layer.

Such a near-field optical means has the great advantage that, as a result of its proximity to the light spots generated on the light-sensitive layer, it opens up the possibility of determining the final size of the light spots on the light-sensitive layer-essentially independently of the preceding beam guidance.

In this respect, the near-field optical means is preferably arranged directly on an underside of the microscope objective facing the light-sensitive layer so that the distance between the near-field optical means and the light-sensitive layer can be kept very small.

The near-field optical means can be designed in the most varied of ways.

One embodiment, for example, provides for the near-field optical means to define the light spots of the light spot pattern by way of aperture-like through regions. In this case, aperture-like through regions can preferably be achieved by way of vapor-deposition of the optical microscope on its side facing the light-sensitive layer.

Another solution provides for the near-field optical means to define the size of the light spots of the light spot pattern by way of beam-concentrating elements. In this case, additional beam-concentrating elements are, for example, provided on the side of the microscope objective facing the light-sensitive layer, wherein these beam-concentrating elements are, in the simplest case, of a conical design in order to obtain the light spots generated on the light-sensitive layer with as small a size as possible.

The inventive near-field optical means can be used particularly advantageously when this reduces the size of the light spots in at least one direction to values clearly below the wavelength of the laser radiation.

In this case, the vector of the electrical field E of the laser radiation is expediently placed such that this is parallel to the direction, in which the extension of the light spots is smaller than the wavelength.

Since the areal extension of the light spot pattern cannot be optionally enlarged without the optical beam guidance means having to be of a complicated design, it is advantageously provided, in order to shorten the required exposure times, for the lithography exposure device to generate several light spot patterns.

Each light spot pattern thereby has light spots arranged in a defined, geometric pattern, wherein the several light spot patterns can be arranged as required relative to one another.

In principle, it is conceivable for the several light spot patterns to be movable in different exposure movement directions.

To avoid any cross-over movements, it is advantageous when the several light spot patterns are movable parallel to a single exposure movement direction.

The several light spot patterns can preferably be used during the same exposure procedure so that larger sections of the light-sensitive layer can be exposed during one exposure procedure.

In principle, it would be possible to generate the several light spot patterns in a time-shifted manner. It is, however, more favorable to generate the several light spot patterns essentially at the same time.

It is of advantage, in particular, in the case of light spot patterns generated essentially at the same time when a separate optical microscope is provided for each light spot pattern.

It is even better when a separate optical beam guidance means is provided for each light spot pattern.

The several light spot patterns could, in principle, be supplied from one set of semiconductor lasers, particularly when the same exposed sections are intended to be generated with each light spot pattern.

The operational possibilities of an inventive lithography exposure device are, however, greater when a separate set of semiconductor lasers is available for each light spot pattern so that different exposed sections can be generated with the light spot patterns.

A solution which is particularly simple to configure provides for several exposure units which operate independently in order to generate the several light spot patterns.

The inventive object is, furthermore, also accomplished in accordance with the invention in a lithographic process for producing plane structures on a substrate by way of the following steps:

a coating step, in which the light-sensitive layer is applied to the substrate, an exposure step, in which exposed and unexposed sections of the light-sensitive layer are generated in accordance with the structure to be produced by controlling the position and intensity of a light spot generated with laser radiation on the light-sensitive layer, and a separation step, in which one of the sections is removed from the substrate, in that during the exposure step a plurality of semiconductor lasers are used for generating the laser radiation, that a light spot of a defined light spot pattern is generated on the light-sensitive layer with the laser radiation exiting from each semiconductor laser and that the entire light spot pattern and the substrate are moved relative to one another in an exposure movement direction for producing the exposed sections and the light spots of the light spot pattern are thereby activated or deactivated in accordance with the shape of the exposed sections to be generated.

The advantage of the inventive lithography process is to be seen in the fact that with it exposed sections with defined contours, in particular, contours directly suitable for semiconductor components, preferably integrated circuits, can be produced at high speed and with low resources from a cost point of view.

The great advantage of the inventive solution is to be seen in the fact that, on the one hand, an adequate laser light power is available at short switching intervals on account of the use of the semiconductor lasers and so the expense related to the laser light power is very slight.

In this respect, it is particularly advantageous when the light spots of the light spot pattern are moved relative to the light-sensitive layer along exposure paths extending parallel to the exposure movement direction, wherein this is brought about, in particular, by moving the substrate supporting the light-sensitive layer. Thus, a particularly time-saving procedure for the production of the exposed sections at high speed and with high precision is specified.

The light spots are preferably controlled such that they are activated in portions of the exposure paths located with their entire surface area above the sections of the light-sensitive layer to be exposed and are deactivated in the remaining portions of the exposure paths. This creates the possibility, in a simple manner, of generating exposed sections with an optional contour as a result of the relative movement between light spots and substrate.

In this respect, it is either possible to work within the sections to be exposed with continuous-wave laser radiation.

Since, however, the rapid switching of the semiconductor lasers is important for the edge precision in the case of edges of the outer contour extending transversely to the direction of movement, exposure is also preferably carried out point by point within the sections to be exposed and thus one light spot placed next to the others.

In order to ensure that the light-sensitive layer also reacts chemically in accordance with the exposure within the exposed sections and, in particular, the exposed sections are exposed in a connected manner within their outer contour and thus the light-sensitive layer also reacts chemically throughout to an adequate degree, it is advantageously provided for the exposed sections to be generated by exposure of strip-like areas of the light-sensitive layer located within the outer contour and extending parallel to the exposure movement direction.

In this respect, the strip-like areas are preferably placed such that they overlap in a transverse direction extending at right angles to the exposure movement direction in order to ensure that the exposure covers the entire surface area.

In this case, it is particularly favorable when, during the exposure step, the light spot pattern is displaced relative to the substrate in the exposure movement direction, then offset relative to the substrate in the transverse direction to the exposure movement direction and again displaced in the exposure movement direction. This solution has the great advantage that it allows a procedure for the production of the sections to be exposed which is as time-saving and efficient as possible.

It is thereby advantageous when, during the relative movement, the light spot pattern is displaced continuously over the entire substrate in the exposure movement direction without any movement transversely to the exposure movement direction so that all the sections to be exposed which are also located behind one another in the exposure movement direction can be generated by a continuous movement of the light spot pattern in the exposure movement direction.

In order to work in as time-saving a manner as possible, it is preferably provided for the light spot pattern, during the relative movement, to be displaced over the entire substrate in the exposure movement direction with an essentially constant speed so that the time-intensive moving and stopping can be omitted.

In this respect, the semiconductor lasers are controlled in a correspondingly rapid manner, wherein the semiconductor lasers work in the activated state either in pulsed operation or continuously.

With respect to the intensive control and time required, it is particularly favorable when the exposure of the sections of the light-sensitive layer to be exposed takes place only during the relative movement of the light spot pattern parallel to a single exposure movement direction.

This means that, in this case, an exposure of the light-sensitive layer takes place only during movement in the direction of the single exposure movement direction whereas each relative movement of the light spot pattern in the transverse direction merely serves to reposition the light spot pattern in the transverse direction but not carry out any exposure with it during the movement in transverse direction.

It is preferably provided, particularly for the exposure of large light-sensitive layers, for the exposure of all the sections of the light sensitive layer to be exposed on the substrate to take place by way of repeated relative movement of the light spot pattern in the exposure movement direction.

A particularly favorable mode of procedure provides for the light spot pattern to be displaced from an initial position, in which the light spots active first of all during the relative movement in exposure movement direction are located above a beginning of the exposed sections to be produced, as far as an end position, in which the light spots last activated are located above an end of the exposed sections to be produced. As a result, a particularly time-efficient mode of procedure is presented.

All the relative movements of the light spots and the substrate mentioned above can be realized either by way of movement of the light spots with a stationary substrate, movement of both the light spots and the substrate or movement of the substrate with the light spots stationary, wherein the relative movement in one direction at least is preferably realized at least as a result of movement of the substrate.

The realization of the relative movement only as a result of movement of the substrate is particularly favorable since the devices already used in mask lithography for moving the substrate relative to the optical imaging means can be used in this case.

The inventive solution can, in principle, be used in all types of lithographic processes. Fields of use of the inventive solution are the production of masks for the manufacture of semiconductors at high speed and with high precision. The inventive solution may, however, be used even more advantageously in the manufacture of semiconductors when these are used for the direct production of exposed sections on the semiconductor wafer with a defined contour, for example, the contours which are required for highly integrated components.

In this case, it is preferably provided for the substrate to be a wafer and for the light spot pattern to be moved across the entire wafer during each relative movement in the direction of movement and only then be displaced transversely to the exposure movement direction.

Additional features and advantages of the inventive solution are the subject matter of the following description as well as the drawings illustrating several embodiments. In the drawings:

DETAILED DESCRIPTION OF THE INVENTION

Figure 1:
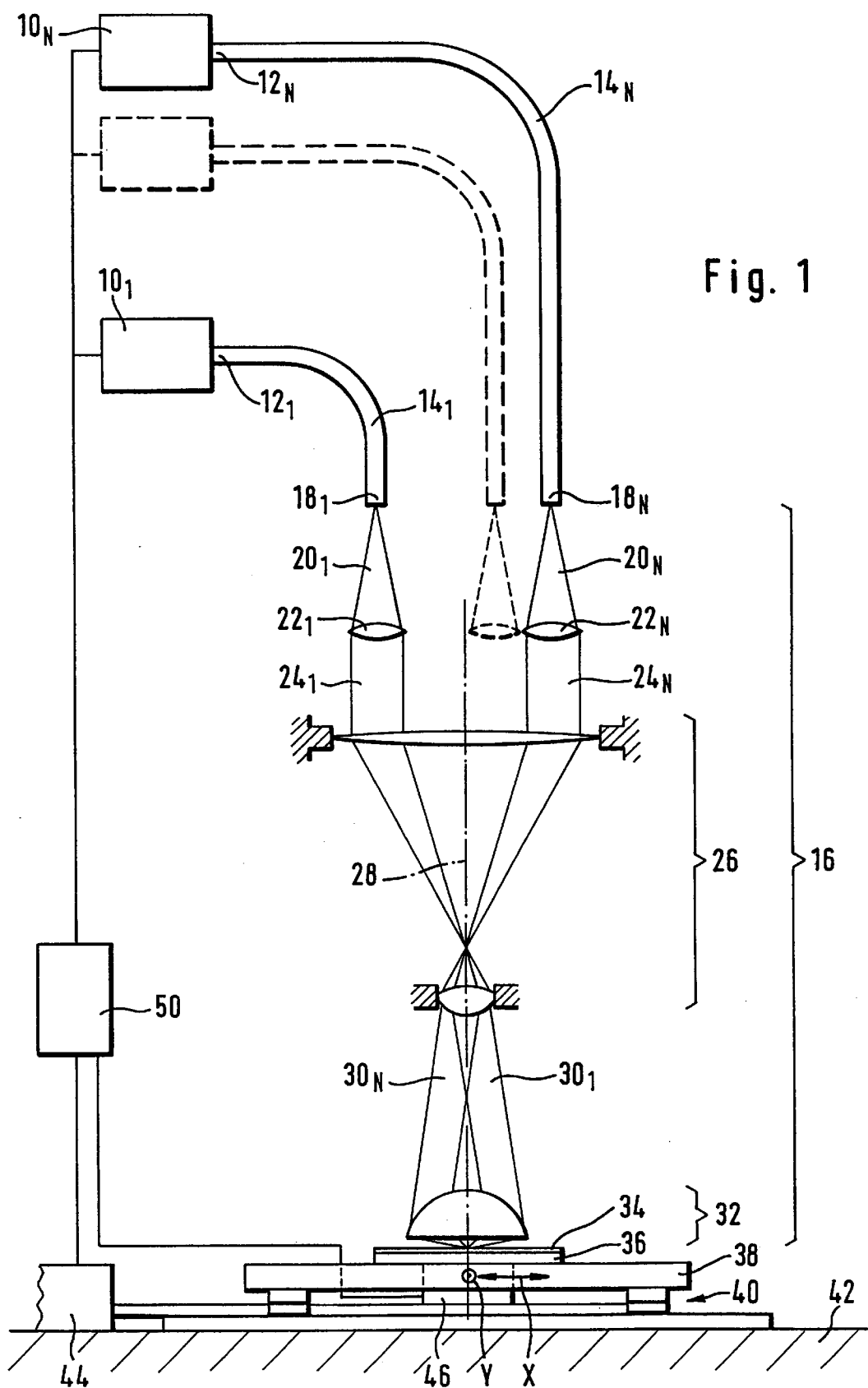
FIG. 1 shows a schematic view of an inventive lithography exposure device.

A first embodiment of an inventive lithography exposure device, illustrated in FIG. 1, comprises a plurality of laser units $10_1$ to $10_N$ which comprise semiconductor lasers and preferably generate laser radiation in the blue spectral range which enters first ends $12_1$ to $12_N$ of light guides $14_1$ to $14_N$, preferably single mode fibers, is guided from these to an optical beam guidance means designated as a whole as 16 and for entering the optical beam guidance means 16 exits from second ends $18_1$ to $18_N$ of the light guides $14_1$ to $14_N$, wherein the second ends $18_1$ to $18_N$ and the optical beam guidance means preferably form an intrinsically inflexible optical unit. The laser radiation exits from the second ends $18_1$ to $18_N$ of the light guides $14_1$ to $14_N$ in the form of divergent beam bundles $20_1$ to $20_N$ and is formed into respectively collimated radiation bundles $24_1$ to $24_N$ by means of respective collimating elements $22_1$ to $22_N$. These collimated radiation bundles $24_1$ to $24_N$ are imaged by an optical telescope 26 comprised by the optical beam guidance means 16 such that their distance from a central axis or axis of symmetry 28 is decreased.

Divergent radiation bundles $30_1$ to $30_N$ again exit from the optical telescope 26 and are then, for their part, imaged by an optical microscope 32 onto a light-sensitive layer 34 applied to a substrate 36, wherein it is necessary to obtain a precise imaging that the optical beam guidance means 16 forms with its second ends $18_1$ to $18_N$, the collimating elements $22_1$ to $22_N$, the optical telescope 26 as well as the optical microscope 32 an optical unit which is intrinsically invariable.

The substrate 36 is, for its part, fixed on a displaceable table 38 forming a mounting device, wherein the displaceable table 38 is fixed so as to be displaceable in two directions X and Y extending at right angles to one another by means of a cross-slide device 40 on a base 42. Two adjustment drives with distance measuring systems 44 and 46 which can be controlled via a control 50 are provided for the exact displacement of the displaceable table 38 relative to the base 42.

All the laser units $10_1$ to $10_N$ can likewise be controlled, in addition, with the control 50.

In order to generate the relative movement between the substrate 36 and the optical beam guidance means 16, the entire optical beam guidance means 16 is preferably arranged so as to be stationary relative to the base 42 so that only the substrate 36 is movable relative to the optical beam guidance means 16 with the light-sensitive layer 34 arranged on it.

Figure 2:
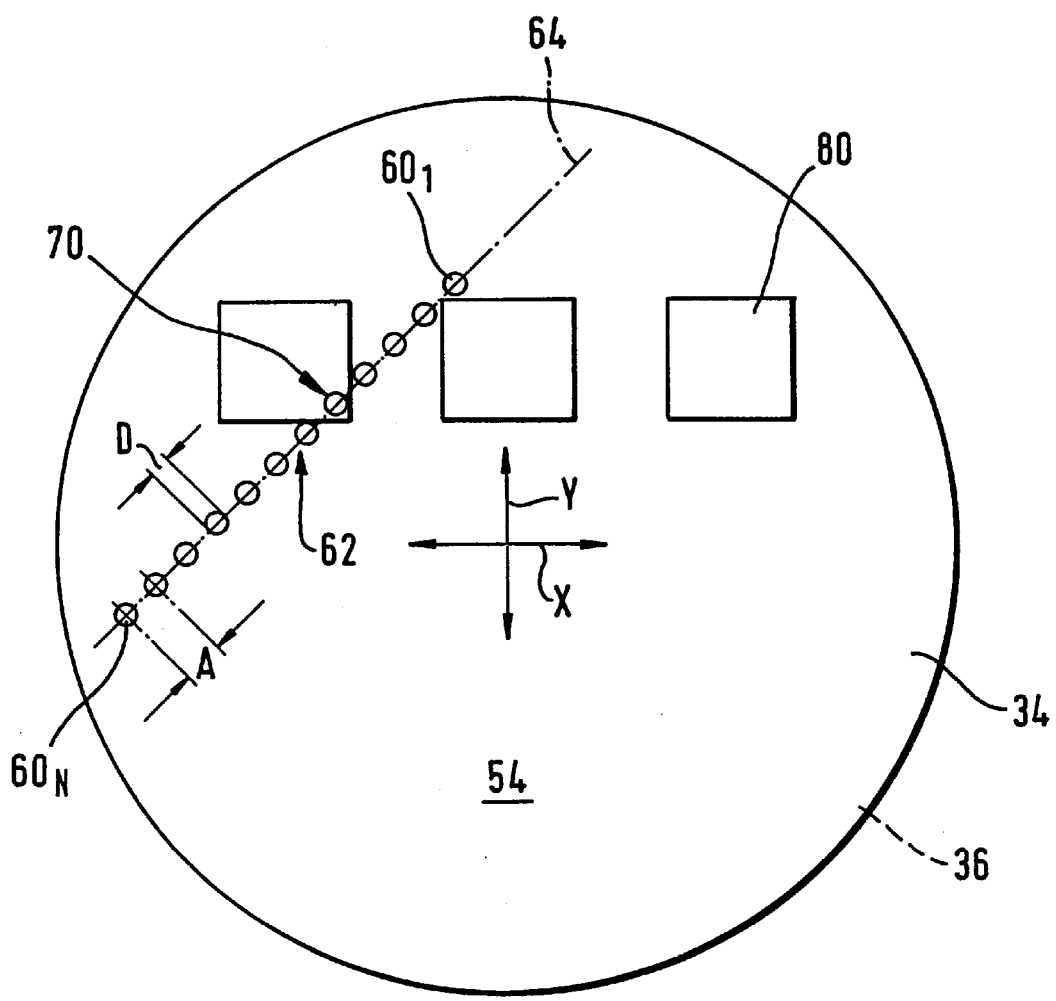
FIG. 2 shows an illustration of a detail of a light spot pattern on a wafer bearing the light-sensitive layer.

As illustrated in FIG. 2, the laser radiation is imaged by the optical microscope 32, for example, onto a surface 54 of the light-sensitive layer 34 such that a plurality of light spots $60_1$ to $60_n$ results, these each having the same diameter D and being arranged at a constant distance A from one another as a series 62 along a series direction 64 and thereby forming a light spot pattern 70 on the surface 54.

As a result of the movement of the substrate 36 in the X and/or Y directions, the entire light spot pattern 70 can be moved across the light-sensitive layer 34 which covers the substrate 36, namely such that each point of the entire surface 54 can be exposed by at least one light spot 60.

The substrate 36 is preferably a wafer of conventional size, on which, as indicated in FIG. 2, a plurality of lithographic structures, for example, for semiconductor components 80 is intended to be generated.

Figure 3:
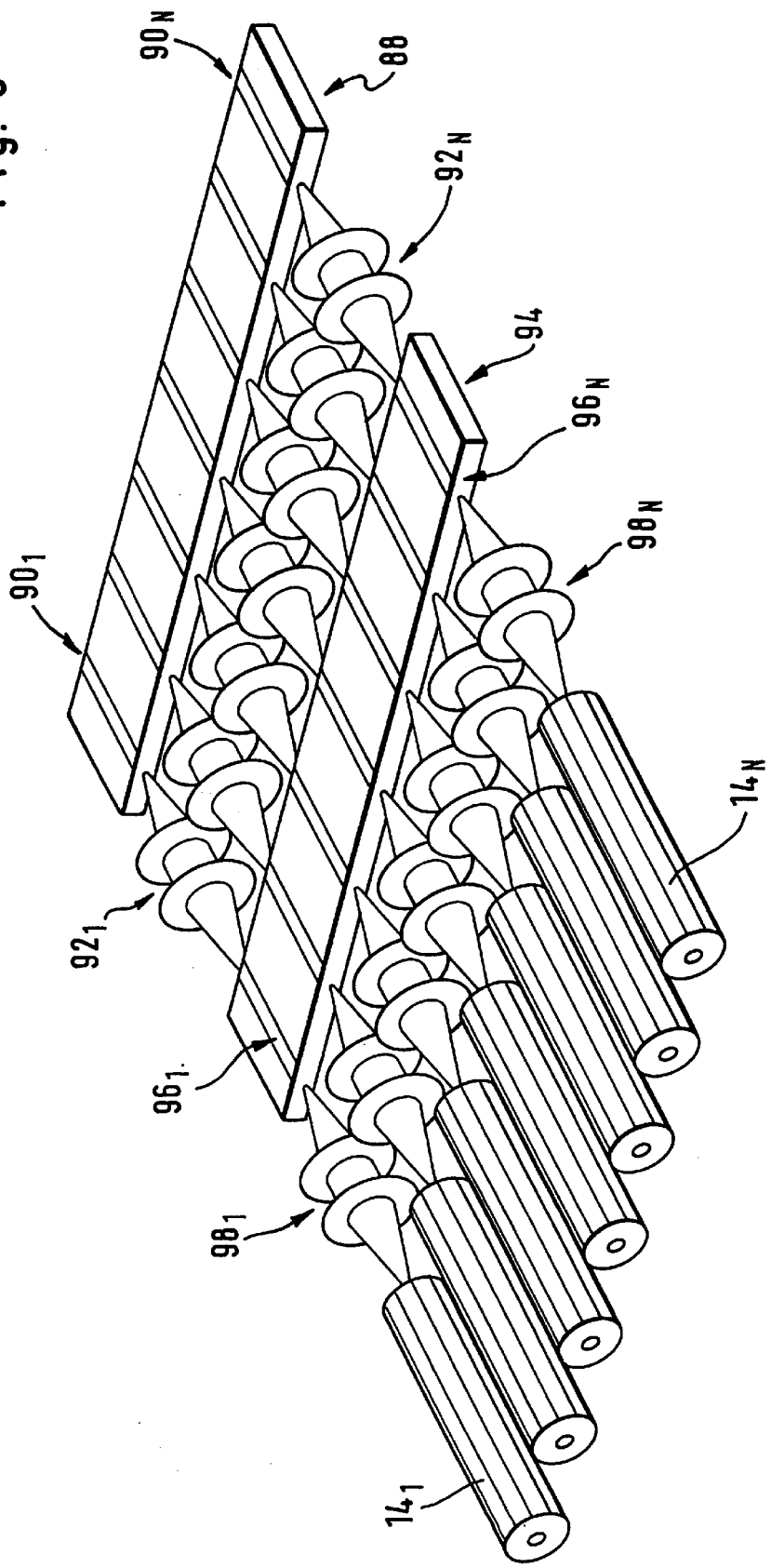
FIG. 3 shows an illustration of a detail of a variation of the inventive solution comprising semiconductor lasers, the laser radiation of which is doubled in frequency.

In a variation of the first embodiment, the laser units 10 are not laser units generating laser radiation directly in the blue spectral range but, as illustrated in FIG. 3, a semiconductor laser array 88 with a plurality of individual semiconductor lasers $90_1$ to $90_N$ is provided which emit laser radiation in the red spectral range and the laser beams of which are imaged by means of individual optical transformation means $92_1$ to $92_N$ onto a doubler arrangement 94 with individual doubler segments $96_1$ to $96_N$ which double the laser radiation of the semiconductor lasers $90_1$ to $90_N$ preferably emitted in the red spectral range or close infrared, wherein the laser radiation exiting from them is then coupled into the individual light guides $14_1$ to $14_N$, by means of additional optical transformation elements $98_1$ to $98_N$.

Figure 4:
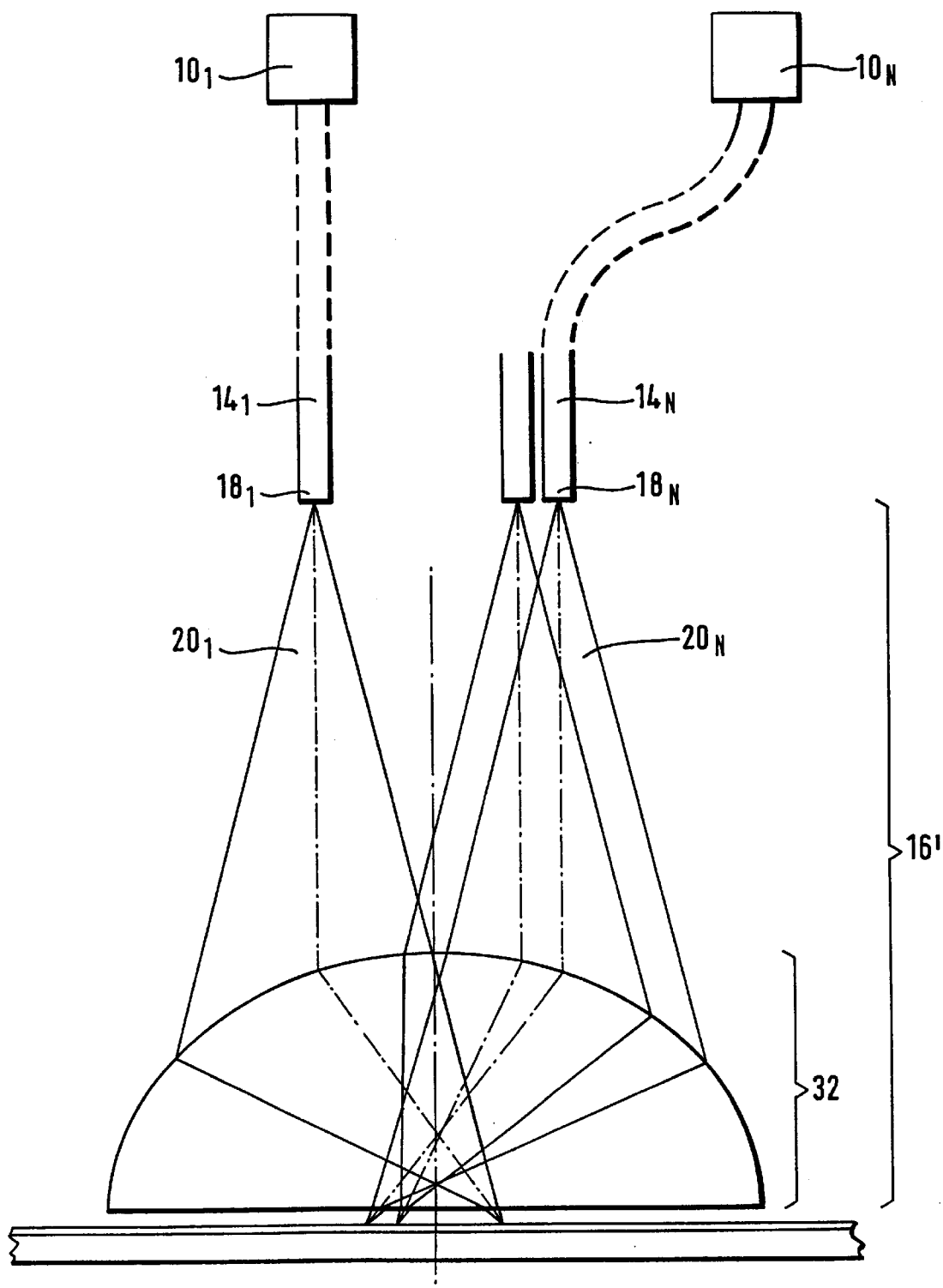
FIG. 4 shows a schematic view similar to FIG. 1 of a third variation of the inventive solution.

In a variation of the first embodiment of an inventive lithography exposure device, illustrated in FIG. 4, it is provided for the light guides $14_1$ to $14_N$ proceeding from the laser units $10_1$ to $10_N$ to lead to an optical beam guidance means 16' which merely comprises the optical microscope 32. In this case, the individual light guides $14_1$ to $14_N$ are arranged so closely next to one another that the divergent laser radiation $20_1$ to $20_N$ exiting from them can immediately enter the optical microscope 32 and no additional, preceding reduction whatsoever is required.

Alternatively to the provision of fiber ends $18_1$ to $18_N$ located next to one another, it is conceivable in an additional variation to arrange a semiconductor array, for example, in the form of vertical emitters directly at the input side of the optical microscope 32.

Figure 5:
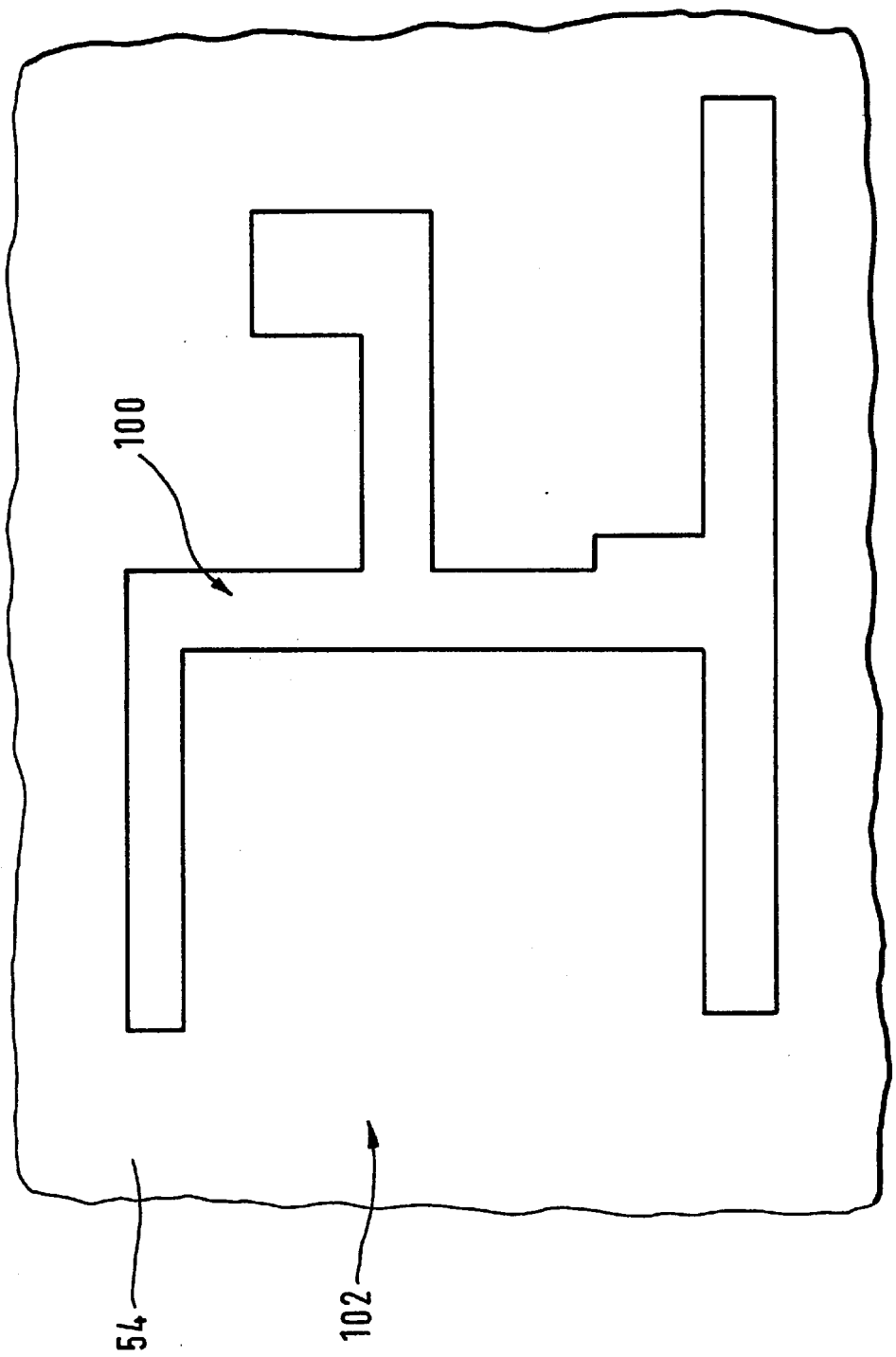
FIG. 5 shows an illustration of an example of a section of the light-sensitive layer to be exposed with its outer contour.
Figure 6:
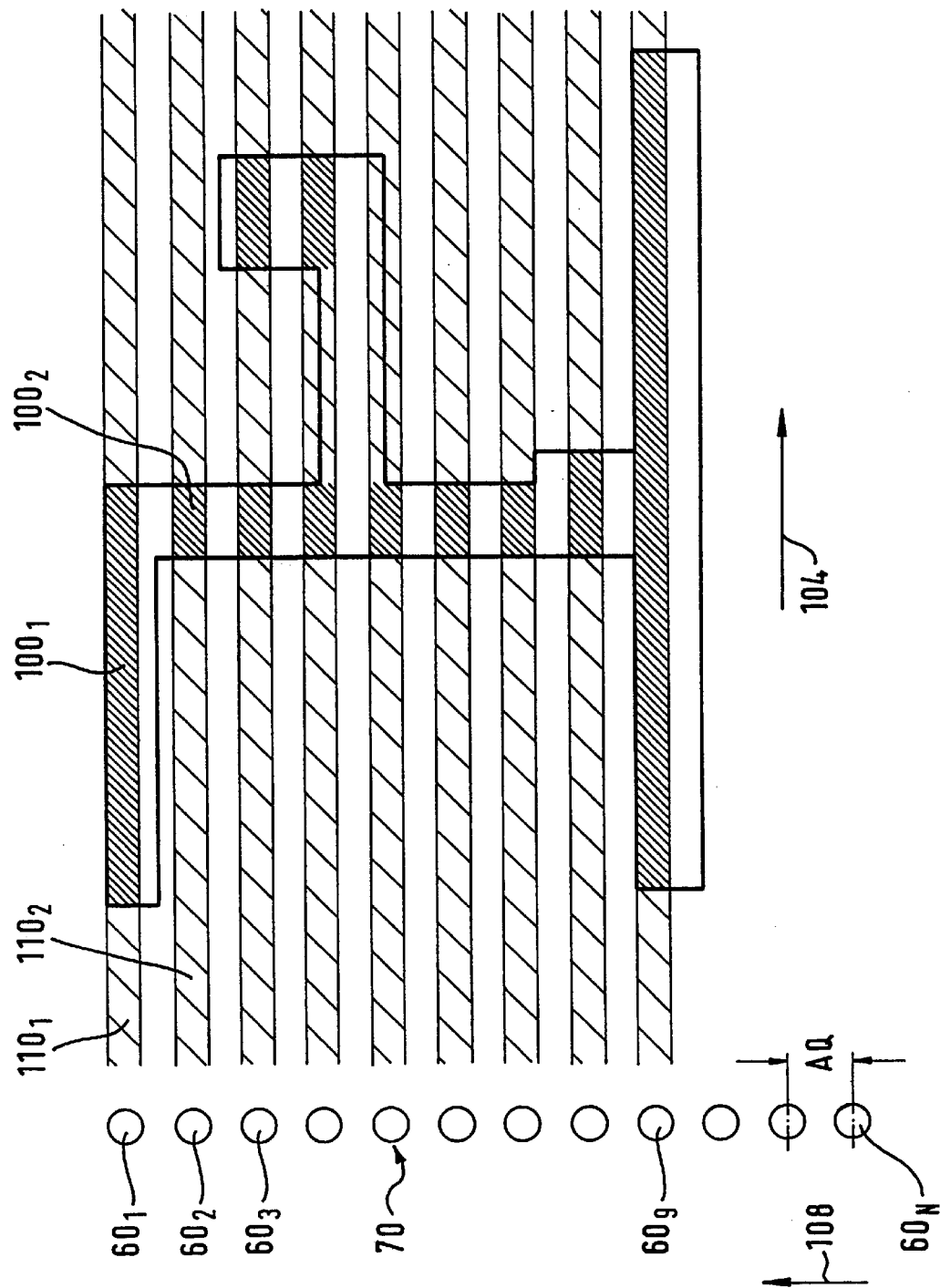
FIG. 6 shows a first exposure movement for the production of the section to be exposed illustrated in FIG. 5.

It is possible with the inventive lithography exposure device, as illustrated in FIG. 5, to produce exposed sections 100 and unexposed sections 102 on the surface 54 of the light-sensitive layer 34 by moving the light spot pattern 70 illustrated in FIG. 6 with the individual light spots $60_1$ to $60_N$, for example, in the following manner.

The light spot pattern 70 is positioned such that during its movement in an exposure movement direction 104, for example, exposure in the region of an exposure path $110_1$ is possible with the light spot $60_1$, wherein this exposure path $110_1$ is located such that a strip-like area $100_1$ of the section 100 to be exposed can be exposed, wherein the light spot $60_1$ is activated during movement along the strip-like exposure path $110_1$ only when the light spot $60_1$ is in the portion of the exposure path $110_1$ which is located above the section 100 to be exposed and is deactivated outside this portion.

In the same way, an exposure with the light spot $60_2$ in the region of the exposure path $110_2$ for generating a strip-like area $100_2$ is possible, wherein the light spot $60_2$ is also activated only in the portions of the exposure path $110_2$ which are located with their entire surface area above the section 100 to be exposed in order to generate the strip-like area $100_2$.

The same applies for the light spots $60_3$ to $60_9$.

Figure 7:
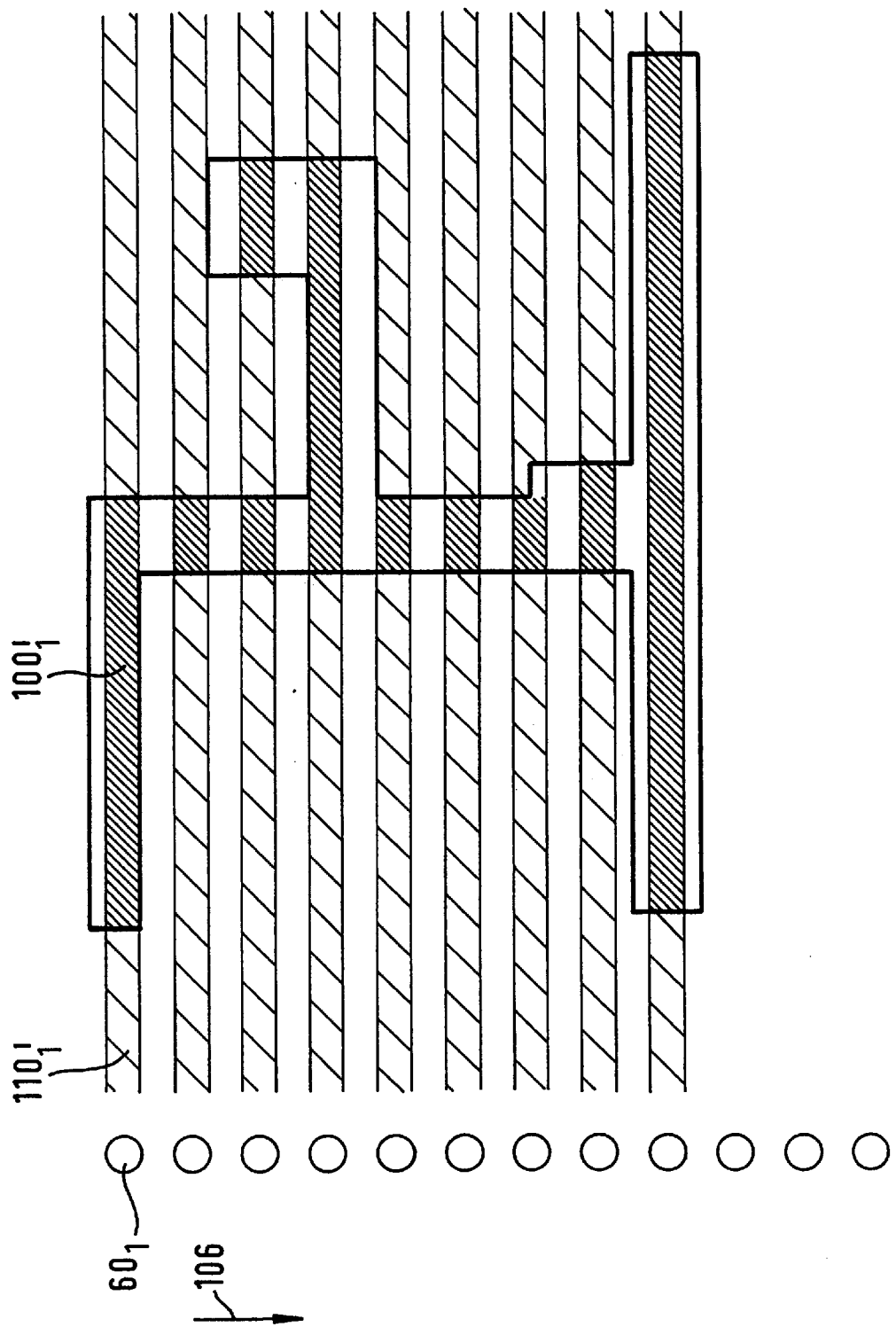
FIG. 7 shows a second exposure movement for the production of the section to be exposed illustrated in FIG. 5.

After traveling once over the section 100 to be exposed, the light spot pattern 70 is displaced transversely in a transverse displacement direction 106 by a predeterminable distance which is, for example, selected such that a strip-like area 100₁' of the section 100 to be exposed can now be exposed with the exposure path 110₁'. The same applies for the remaining strip-like areas 110₂' to 110₉', wherein the exposure paths 110₁ and 110₁' are intended to overlap in the transverse displacement direction 106 (FIG. 7).

The exposure path 110₁' is preferably located such that the strip-like area 100₁' defines an edge of the section to be exposed which extends parallel to the exposure movement direction 104.

Figure 8:
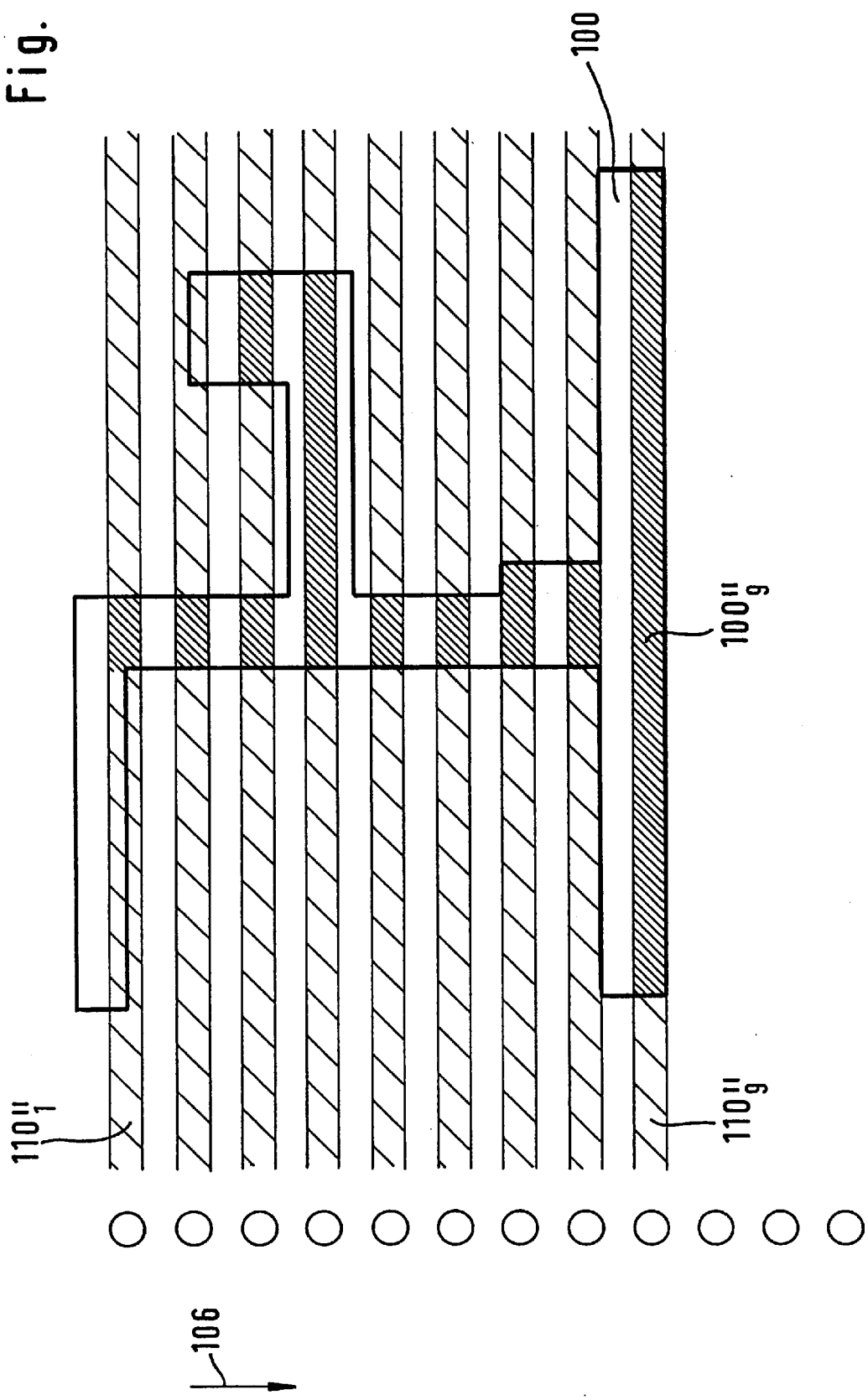
FIG. 8 shows a third exposure movement for the production of the section to be exposed illustrated in FIG. 5.

After travel over the section 100 to be exposed, an additional movement in the transverse displacement direction 106 takes place, as illustrated in FIG. 8.

Additional strip-like areas 100₁" to 100₉" of the section 100 to be exposed can be exposed with the exposure path 110" displaced further, wherein a longitudinal edge of the section 100 to be exposed can, for example, be generated with the strip-like area 100₉".

Figure 9:
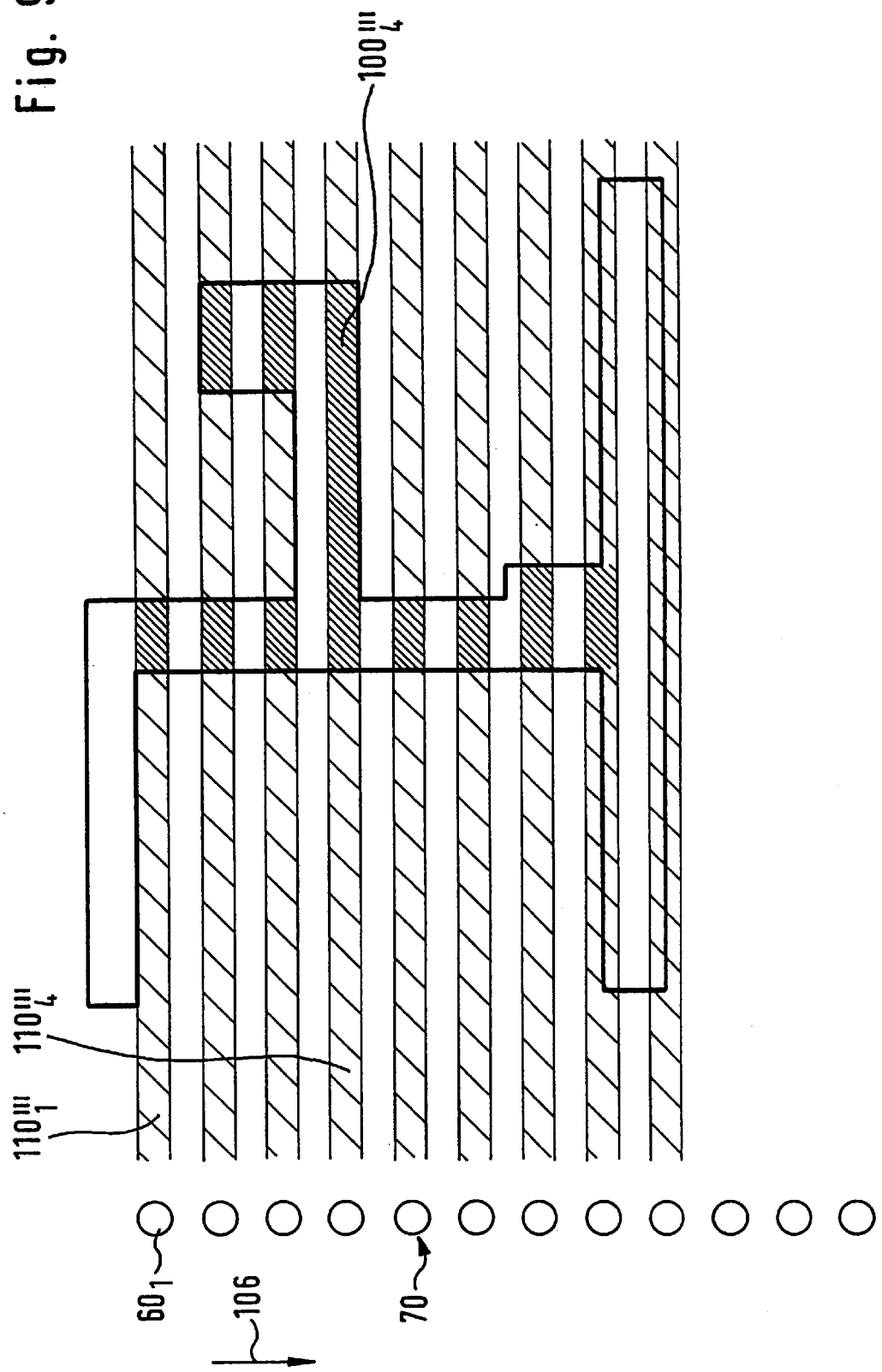
FIG. 9 shows a fourth exposure movement for the production of the section to be exposed illustrated in FIG. 5.

As a result of a further displacement of the light spot pattern 70 in transverse direction 106 after traveling over the section 100 to be exposed, according to FIG. 9, the strip-like area 100₄''', with which an additional longitudinal edge of the section to be exposed is generated, can be generated with the exposure path 110₄'''.

As for the rest, during each traveling over the section 100 to be exposed each of the light spots 60 is always activated when the respective exposure path 110, 110', 110" or 110''' fully covers the section 100 to be exposed and so, in this case, a strip-like area of the section 100 to be exposed can be generated each time, wherein all the strip-like areas overlap in the direction of the transverse displacement direction 106 so that, in the end, the sum of all the overlapping strip-like areas results altogether in the section 100 to be exposed after, for example, travel four times over the section 100 to be exposed parallel to the exposure movement direction 104 and respective, subsequent displacement in the transverse displacement direction 106.

Figure 10:
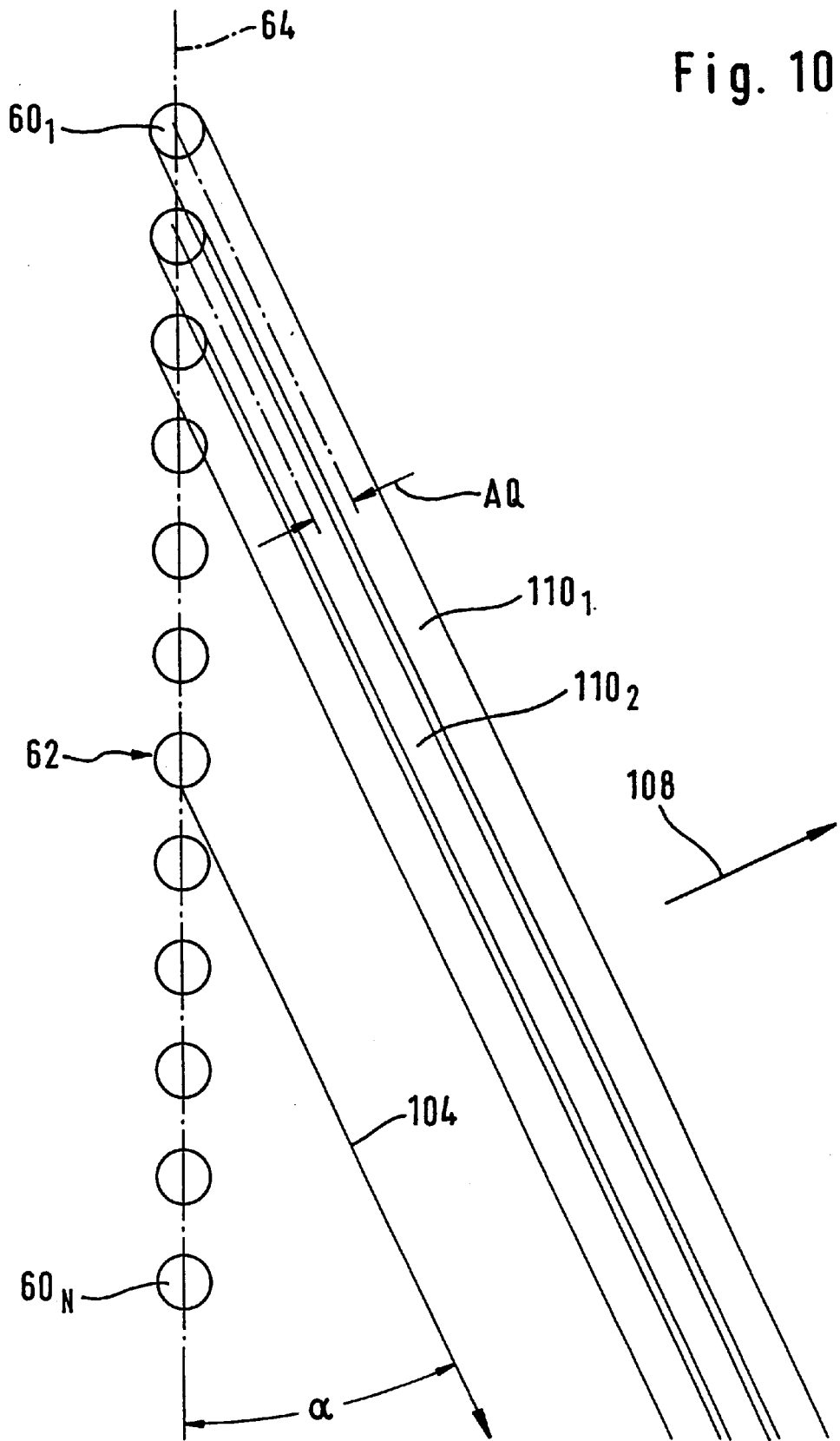
FIG. 10 shows a second embodiment of an inventive lithography coating device with light spots of the light spot pattern arranged in a row.

In order not to have to carry out a transverse displacement in the transverse displacement direction 106 after each traveling over the section 100 to be exposed for the production of the strip-like areas overlapping one another, the series direction 64 of the series 62 of individual light spots 60₁ to 60ₙ is placed, in a second embodiment of the inventive solution, such that this extends at an acute angle α in relation to the exposure movement direction 104, namely at such an acute angle α that the exposure strips 110₁, 110₂, 110₃ etc. overlap one another in a transverse direction 108 at right angles to the exposure movement direction 104, as illustrated in FIG. 10. Proceeding from the light spot 60₁ which serves, for example, as a reference, all the remaining light spots 60₂ to 60ₙ then have in the transverse direction 108 a distance AQ from the light spot 60₁ which is different for each light spot 60₂ to 60ₙ and so a row of distances AQ₂ to AQₙ results which always differs by the increment d, as illustrated in FIG. 11.

This means that it is no longer necessary, as illustrated in FIGS. 6 to 9, to carry out a transverse displacement after each traveling over the section 100 to be exposed in order to generate overlapping exposure paths 110 but it is merely necessary to travel once over the section 100 to be exposed with the entire light spot pattern 70 and always activate the light spot in the portion of the exposure path 110 which fully covers the section 100 to be exposed.

Figure 11:
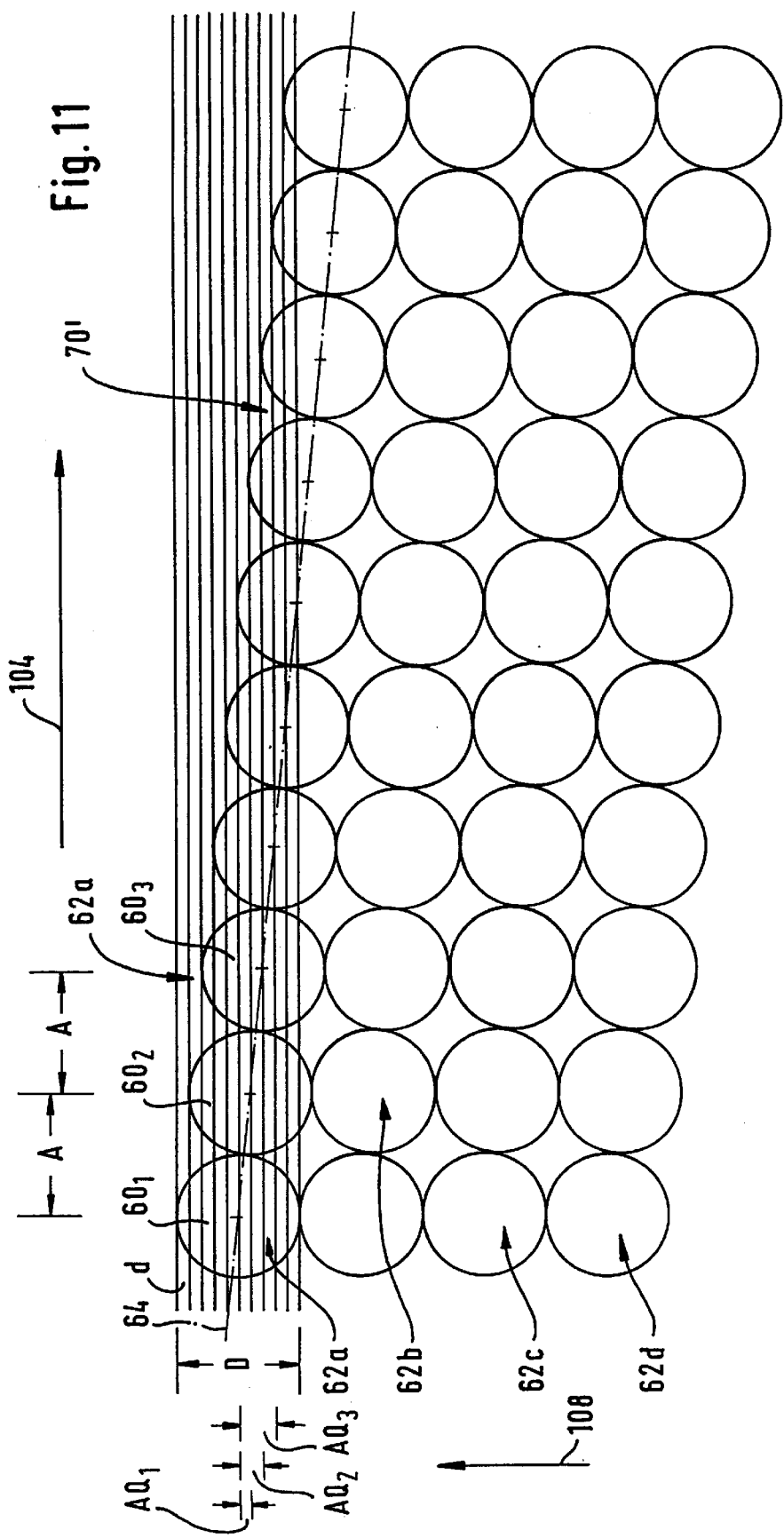
FIG. 11 shows a third embodiment of a lithography coating device according to FIGS. 1 or 4 with a special light spot pattern.

In order to obtain as fine a writing raster as possible in the transverse direction 108 extending at right angles to the exposure movement direction 104, the series direction 64 of the series 62 is arranged in a third embodiment of the inventive solution, as illustrated in FIG. 11, at such an acute angle α relative to the exposure movement direction 104 that consecutive light spots 60₁, 60₂ or 60₂, 60₃ etc. are displaced in the transverse direction 108 through a fraction of a diameter D of the light spots 60 corresponding to the increment d and so, as illustrated in the embodiment according to FIG. 11, a writing raster with an increment d can, for example, be achieved which represents one tenth of the diameter D of the light spot 60. This means that the light spot 60₁₀ of the series 62 is displaced in relation to the light spot 60₁ in the transverse direction 108 through the width 10×d= D.

Coarser writing rasters are, however, conceivable, wherein the writing rasters determined by the increment d should be at least a quarter of D in order to obtain an adequate fineness of the writing raster in the transverse direction 108 at right angles to the exposure movement direction 104.

In this case, the light spot pattern 70₁ is preferably formed by a plurality of series 62ₐ to 62_d of light spots 60 extending parallel to one another, wherein a predetermined increment d exists in the transverse direction 108 within each series from light spot to light spot.

Figure 12:
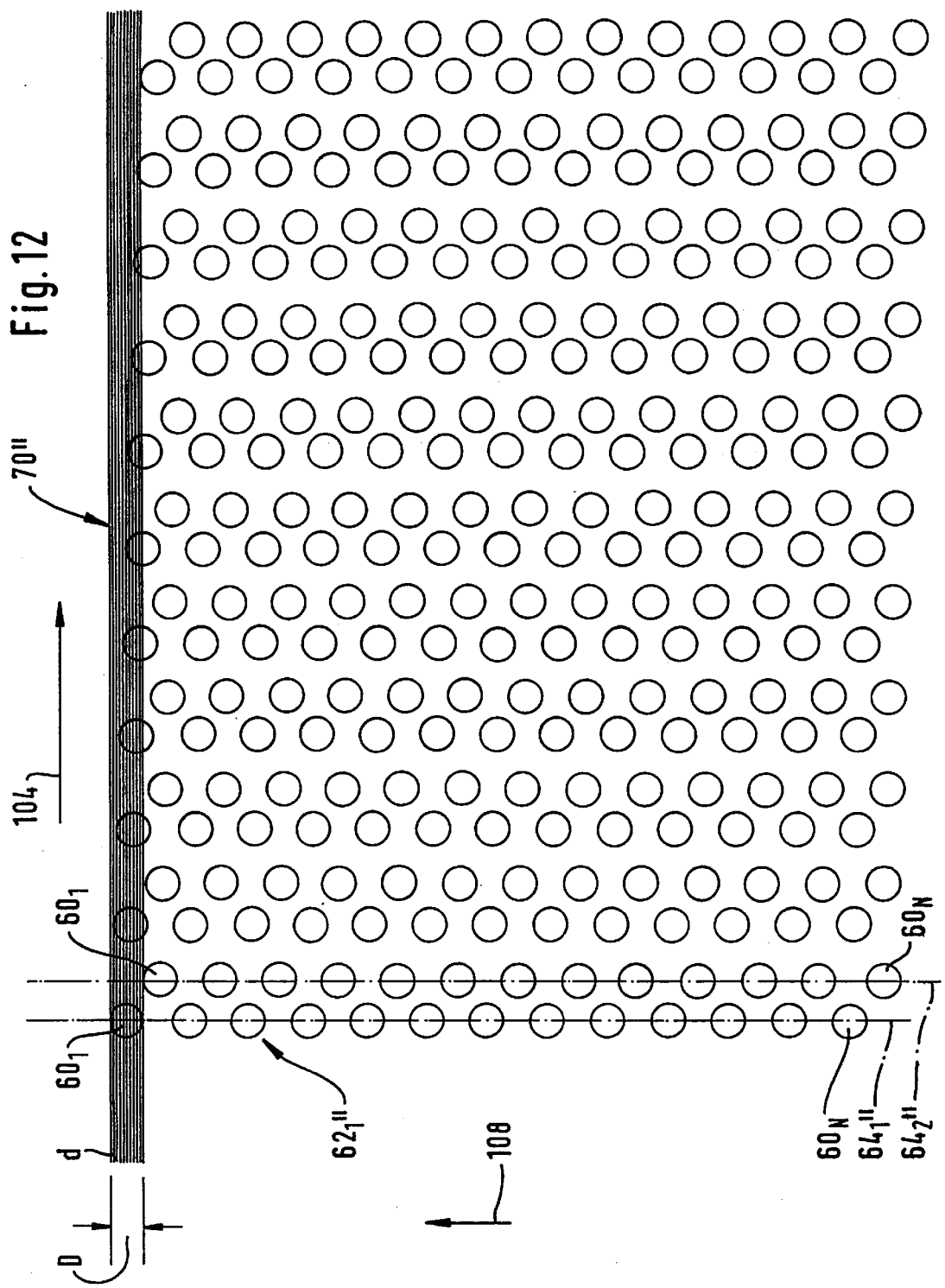
FIG. 12 shows a fourth embodiment of an inventive lithography coating device according to FIGS. 1 or 4 with a special light spot pattern.

In a fourth embodiment of an inventive light spot pattern 70", illustrated in FIG. 12, the series directions 64 of the individual series 62" extend at right angles to exposure movement 104, the light spots 60 of the individual series 62" are, however, offset relative to one another such that in the entire light spot pattern 70' an additional light spot exists for each light spot 60 and this is offset through one increment d in the transverse direction 108 at right angles to the exposure movement direction 104.

It is thus possible, altogether, with such a light spot pattern 70" to generate exposure paths 110 with a resolution d which are located one next to the other in the transverse direction 108, and thus to generate the strip-like areas 100 required for the production of the exposed section 100 so that these overlap, wherein the entire light spot pattern 70" travels across the light-sensitive layer 34 of the substrate 36 in the exposure movement direction 104 in one go, namely preferably over the entire substrate 36. A precise exposure of the substrate 36 is thereby possible within the "width" at right angles to the exposure movement direction 104 as determined by the light spot pattern 70" since the relative arrangement of the light spots in relation to one another and the size of them remains unchanged.

Insofar as the light spot pattern 70" does not already extend over the entire substrate 36 in the transverse direction 108, the light spot pattern 70" is then to be offset as a whole in the transverse direction 108 by a distance which corresponds to the extension of the light spot pattern 70" in the transverse direction 108, wherein during each traveling over the light-sensitive layer 34 an exposure is possible over the entire extension of the light spot pattern 70" in the transverse direction 108 and so fewer exposure movements of the light spot pattern 70" in the exposure movement direction 104 are required in order to expose the entire light-sensitive layer 34 on the substrate 36, the number of exposure movements resulting from the extension of the light-sensitive layer 34 in the transverse direction 108 divided by the extension of the light spot pattern 70" in this direction.

Figure 13:
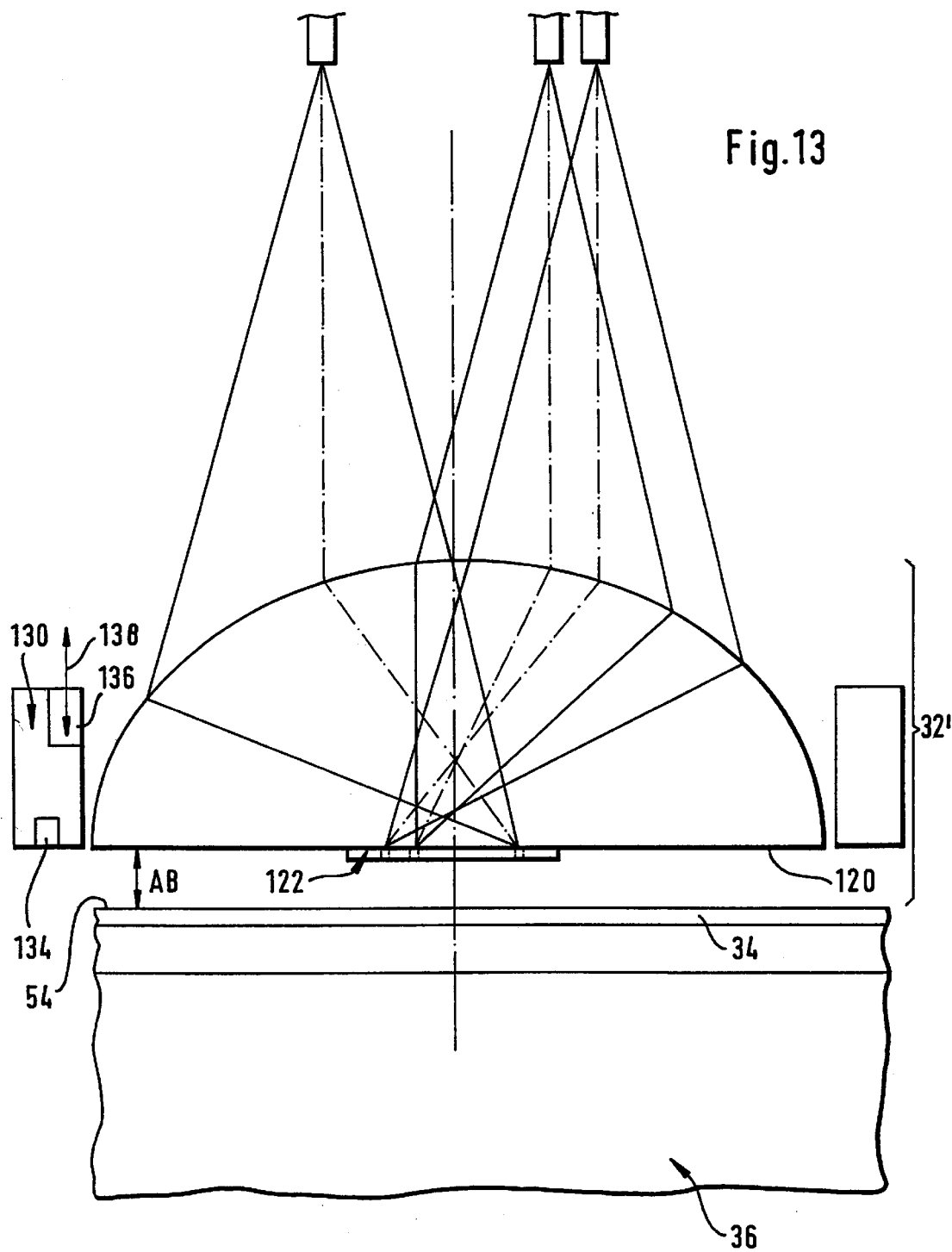
FIG. 13 shows a fifth embodiment of an inventive lithography coating device according to FIG. 4 with a first variation of a near-field optical means.

In a fifth embodiment of the inventive solution, illustrated in FIG. 13, the lithography exposure device is constructed in the same manner as in the preceding embodiments, with the difference that the optical microscope 321 is provided on its side 120 facing the light-sensitive layer 34 with a near-field optical means 122 which is arranged in the region, in which the laser radiation imaged in a reduced manner by the optical microscope 321 exits from it. The near-field optical means 122 can be designed in the most varied of ways.

Figure 14:
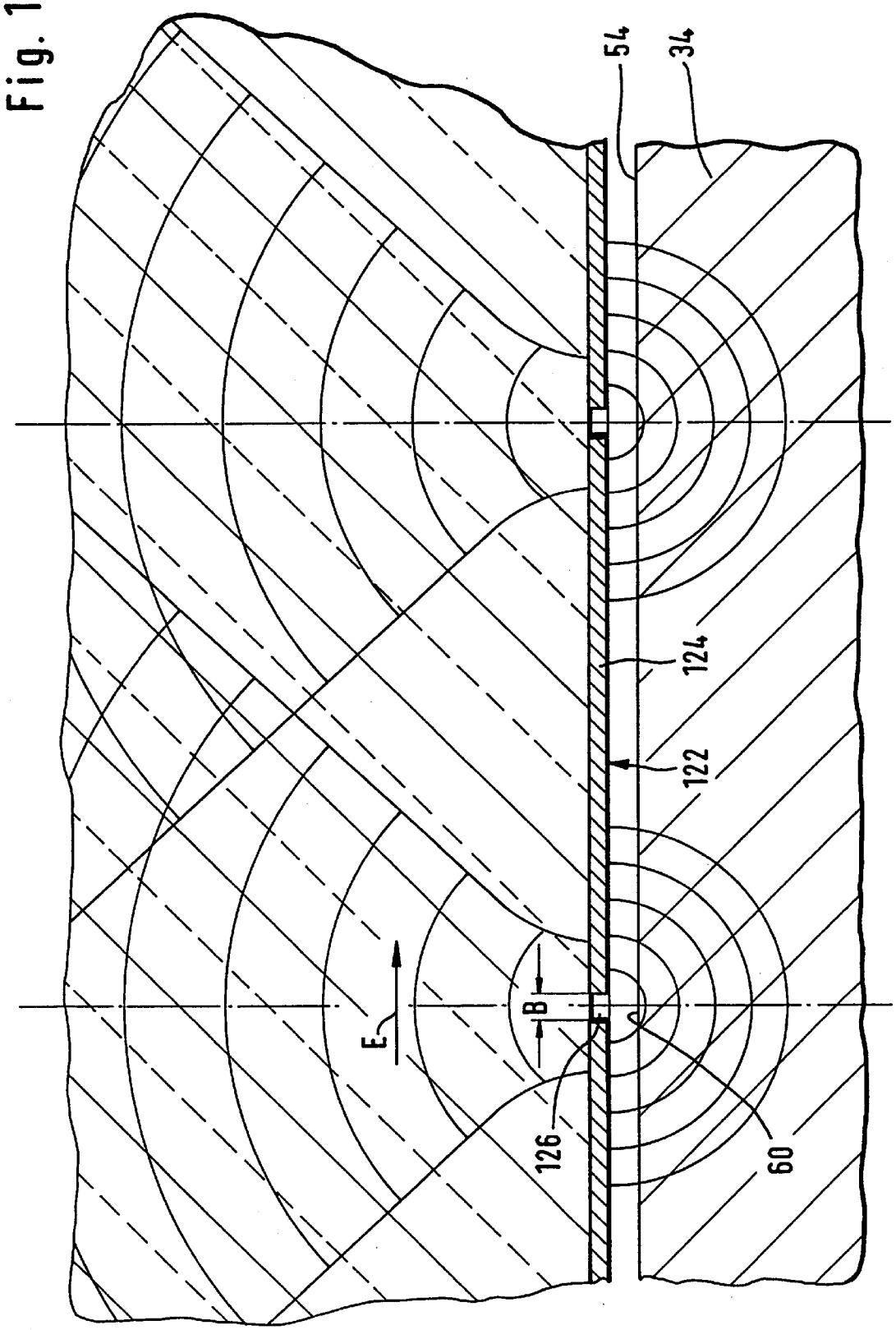
FIG. 14 shows an enlarged illustration of the nearfield optical means according to FIG. 13

As illustrated in FIG. 14, the near-field optical means is formed by a coating 124 which is designed to be reflecting or absorbing and has aperture-like openings 126, through which the laser radiation then exits. The size of the light spots 60 can be determined with the aperture-like openings 126 independently of the beam shaping as a result of the rest of the optical microscope 32'. For example, the aperture-like openings 126 can be dimensioned such that the light spots 60 have in at least one direction an extension which is the size of the wavelength of the laser light used or smaller. Thus, extensions of the light spots in the order of magnitude of, for example, several 100 but also 100 or 200 nanometers can be achieved, at least in one direction, wherein, in this case, the incoming light wave must have a vector of the electrical field E which extends parallel to the width B which has such a dimension.

The aperture-like openings 126 must then preferably have at right angles to the width B a dimension which is at least in the order of magnitude of the wavelength and corresponds at least to the extension of the B field of the light wave.

The laser radiation exiting out of the aperture-like opening 126 can no longer be described with the laws of geometric optics on account of the size of the aperture-like opening 126 but rather as a spherical wave, as illustrated in FIG. 14, wherein, in this case, the spherical wave determines the dimension of the light spot 60 on the surface 54 of the light-sensitive layer 34.

For this reason it is necessary to provide the optical microscope 32' with a height adjustment device 130 which guides the near-field optical means 122 at a defined distance AB above the surface 54 of the light-sensitive layer 34 during the exposure movements in the exposure movement direction 134. The height adjustment device 130 preferably keeps the near-field optical means 122 and thus the entire optical microscope 32' at a distance AB above the surface 54 of the light-sensitive layer 34 which corresponds approximately to the size of the light spot 60, i.e. is thus approximately in the order of magnitude of the wavelength of the laser light. This ensures that the size of the light spot 60 is not altered by the distance AB between the surface 54 and the near-field optical means 122 being changed considerably during the exposure movement in exposure movement direction.

Such a height adjustment device 130 preferably operates with a sensor 134 which constantly detects the distance from the surface 54, and a control element 136 which preferably adjusts the entire optical microscope 32' in a height direction 138 at right angles to the surface 54.

Variations in the thickness of the substrate 36 as well as the thickness of the light-sensitive layer 34 can thus be compensated with such a height adjustment means 130.

Figure 15:
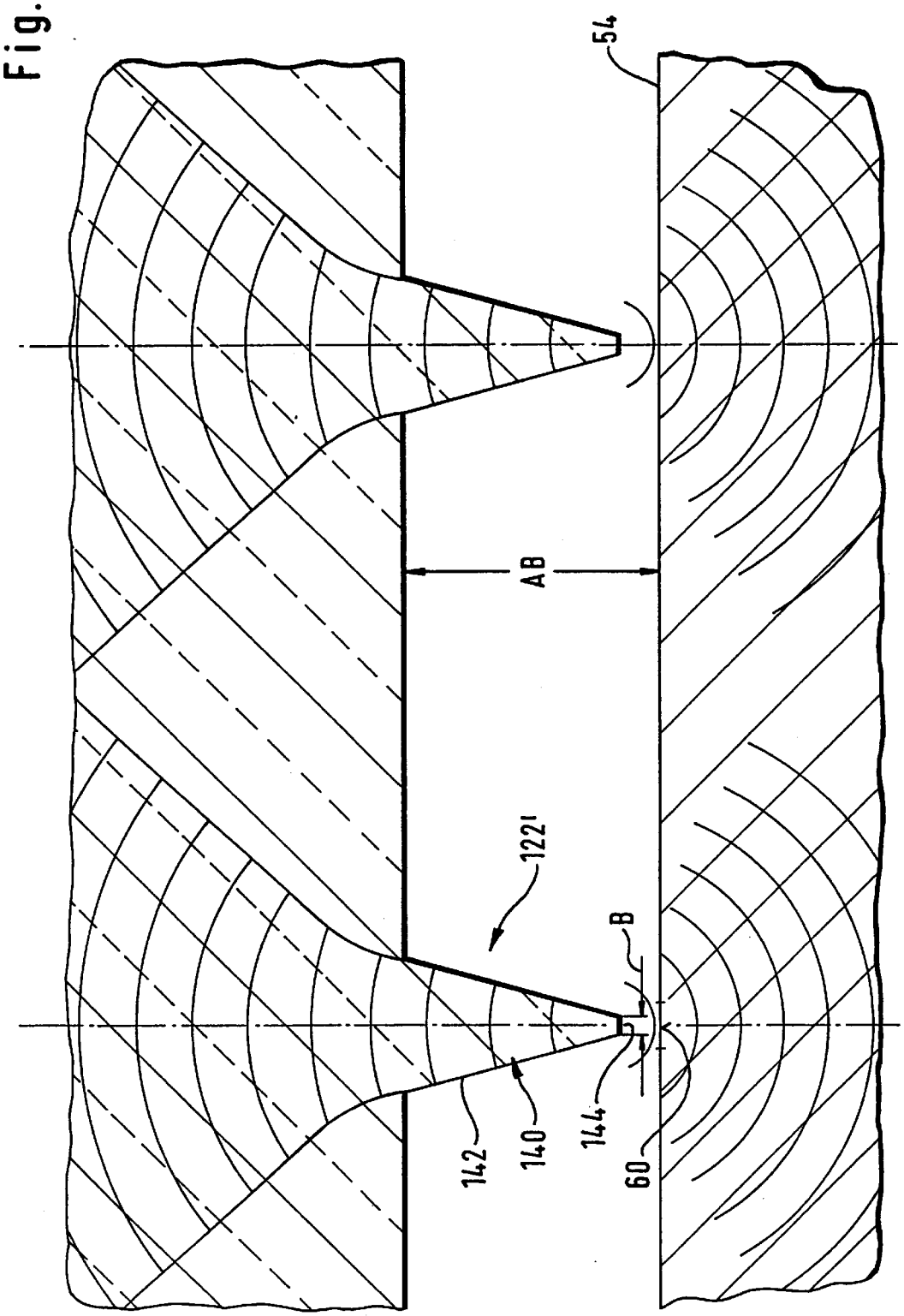
FIG. 15 shows a second variation of the near-field optical means according to the fifth embodiment.

In a variation 122' of the near-field optical means 122 illustrated in FIG. 15, cones 140 consisting of a material corresponding to the material of the optical microscope 32' are integrally formed instead of the aperture-like openings 126, wherein a casing surface 142 of the cones 140 leads to a total reflection of the light wave which then exits in the region of a flattened cone tip 144. The flattened cone tip 144 can have a width B which is in the order of magnitude of the wavelength or smaller than this so that the light wave then exiting out of the surface 144 is likewise to be described as a spherical wave and results in a light spot 60 which has an extension in the order of magnitude of the light wave, for example, in the range of 100 or 200 nanometers, at least in the direction of the width B.

It is also necessary in this embodiment to guide the optical microscope 32' at a defined distance AB above the surface 54 and so the height adjustment device 130 is also required in this embodiment to prevent variations in the size of the light spots 60.

What is claimed is:

1. A lithography exposure device comprising:
    a mounting device for a substrate provided with a layer sensitive to light,
    an exposure unit comprising a plurality of semiconductor lasers and an optical beam guidance means for generating a defined light spot pattern with non-overlapping light spots on the light-sensitive layer of the substrate held in the mounting device,
    said optical beam guidance means comprising an optical element for guiding the laser radiation of each semiconductor laser to one light spot of said defined light spot pattern,
    said light spot pattern having light spots arranged at distances in a transverse direction extending at right angles to an exposure movement direction,
    wherein, in said transverse direction, each light spot of the light spot pattern has a different distance than the remaining light spots from one of said light spots serving as a reference, said distances of all the light spots of the light spot pattern forming a series of distances, each distance being greater by one increment (d) than another one of the distances, and the increment being smaller than an extension of the light spots in the transverse direction,
    a movement unit for generating relative movement between the one optical element of the exposure unit and the mounting device, and
    a control for controlling the intensity and position of the light spots on the light-sensitive layer of the substrate, so that the entire light spot pattern and the mounting device are movable relative to one another in an exposure movement direction, and the light spots of the light spot pattern are thereby activatable or deactivatable in accordance with the shape of the sections to be exposed.

2. A lithography exposure device as defined in claim 1, wherein the increment (d) is at the most half the extension of the light spots in the transverse direction.

3. A lithography exposure device as defined in claim 1, wherein the light spot pattern comprises at least one series of light spots arranged in a row, said light spots having at right angles to the exposure movement direction a distance from one another smaller than their extension at right angles to the exposure movement direction.

4. A lithography exposure device as defined in claim 3, wherein the distance between the light spots of the series is constant at right angles to the exposure movement direction.

5. A lithography exposure device as defined in claim 3, wherein the light spots of said series are arranged in a row extending along a straight line.

6. A lithography exposure device as defined in claim 5, wherein in a respective row the light spots have a distance from one another in said series direction which is greater than their extension in the series direction.

7. A lithography exposure device as defined in claim 6, wherein the series direction forms an angle ($\alpha$) other than 90° with respect to the exposure movement direction.

8. A lithography exposure device as defined in claim 1, wherein the exposure unit comprises frequency doublers post-connected to the semiconductor lasers.

9. A lithography exposure device as defined in claim 1, wherein the exposure unit comprises light guides guiding the laser radiation to the optical beam guidance means.

10. A lithography exposure device as defined in claim 9, wherein:
the light guides have a first end into which the laser radiation is adapted to be coupled, and a second end from which the laser radiation is adapted to exit, and
a collimating element is arranged to follow each second end to collimate the laser radiation exiting divergently out of each individual second end of the light guides and form a collimated radiation bundle therefrom.

11. A lithography exposure device as defined in claim 1, wherein the optical beam guidance means comprises a telescope imaging in a reducing manner.

12. A lithography exposure device as defined in claim 1, wherein several light spot patterns are generated.

13. A lithography exposure device, comprising:
a mounting device for a substrate provided with a layer sensitive to light;
an exposure unit comprising a plurality of semiconductor lasers and an optical beam guidance means for generating a light spot on the light-sensitive layer of the substrate held in the mounting device;
the optical beam guidance means being adapted to guide the laser radiation of each semiconductor laser to a light spot of a defined light spot pattern;
the optical beam guidance means comprising an optical microscope adapted to generate the light spots;
the optical microscope being arranged on a height positioning device for positioning the microscope at a defined distance above the light-sensitive layer during the exposure movement;
a movement unit for generating relative movement between the optical beam guidance means of the exposure unit and the mounting device; and
a control for controlling the intensity and position of the light spot on the light-sensitive layer of the substrate, wherein:
the entire light spot pattern and the mounting device are movable relative to one another in an exposure movement direction and the light spots of the light spot pattern are thereby activatable or deactivatable in accordance with the shape of the sections to be exposed.

14. A lithography exposure device as defined in claim 13, wherein the height positioning device is adapted to maintain a predetermined distance between an underside of the optical microscope facing the light-sensitive layer and the light-sensitive layer.

15. A lithography exposure device as defined in claim 13, wherein said defined distance is on the order of magnitude of a diameter of the individual light spot on the light-sensitive layer.

16. A lithography exposure device, comprising:
a mounting device for a substrate provided with a layer sensitive to light;
an exposure unit comprising a plurality of semiconductor lasers and an optical beam guidance means for generating a light spot on the light-sensitive layer of the substrate held in the mounting device;
the optical beam guidance means being adapted to guide the laser radiation of each semiconductor laser to a light spot of a defined light spot pattern;
the optical beam guidance means comprising an optical microscope adapted to generate the light spots;
said optical microscope being provided with a near-field optical means for defining the size of the light spots on the light-sensitive layer;
the near-field optical means being arranged directly on an underside of the optical microscope facing the light-sensitive layer;
a movement unit for generating relative movement between the optical beam guidance means of the exposure unit and the mounting device; and
a control for controlling the intensity and position of the light spot on the light-sensitive layer of the substrate; wherein:
the entire light spot pattern and the mounting device are movable relative to one another in an exposure movement direction and the light spots of the light spot pattern are thereby activatable or deactivatable in accordance with the shape of the sections to be exposed.

17. A lithography exposure device, comprising:
a mounting device for a substrate provided with a layer sensitive to light;
an exposure unit comprising a plurality of semiconductor lasers and an optical beam guidance means for generating a light spot on the light-sensitive layer of the substrate held in the mounting device;
the optical beam guidance means adapted to guide the laser radiation of each semiconductor laser to a light spot of a defined light spot pattern;
the optical beam guidance means comprising an optical microscope adapted to generate the light spots;
said optical microscope being provided with a near-field optical means for defining the size of the light spots on the light-sensitive layer;
the near-field optical means defining the light spots of the light spot pattern by way of aperture-like through regions;
a movement unit for generating relative movement between the optical beam guidance means of the exposure unit and the mounting device; and
a control for controlling the intensity and position of the light spot on the light-sensitive layer of the substrate; wherein:
the entire light spot pattern and the mounting device are movable relative to one another in an exposure movement direction and the light spots of the light spot pattern are thereby activatable or deactivatable in accordance with the shape of the sections to be exposed.

18. A lithography exposure device, comprising:
a mounting device for a substrate provided with a layer sensitive to light;
an exposure unit comprising a plurality of semiconductor lasers and an optical beam guidance means for generating a light spot on the light-sensitive layer of the substrate held in the mounting device;
the optical beam guidance means being adapted to guide the laser radiation of each semiconductor laser to a light spot of a defined light spot pattern;
the optical beam guidance means comprising an optical microscope adapted to generate the light spots;
said optical microscope being provided with a near-field optical means for defining the size of the light spots on the light-sensitive layer;

the near-field optical means defining the size of the light spots of the light spot pattern by way of beam-concentrating elements;

a movement unit for generating relative movement between the optical beam guidance means of the exposure unit and the mounting device; and a control for controlling the intensity and position of the light spot on the light-sensitive layer of the substrate;

wherein:

the entire light spot pattern and the mounting device are movable relative to one another in an exposure movement direction and the light spots of the light spot pattern are thereby activatable or deactivatable in accordance with the shape of the sections to be exposed.

19. A lithography exposure device, comprising:

a mounting device for a substrate provided with a layer sensitive to light;

an exposure unit comprising a plurality of semiconductor lasers and an optical beam guidance means for generating a light spot on the light-sensitive layer of the substrate held in the mounting device;

the optical beam guidance means being adapted to guide the laser radiation of each semiconductor laser to a light spot of a defined light spot pattern;

the optical beam guidance means comprising an optical microscope adapted to generate the light spots;

said optical microscope being provided with a near-field optical means for defining the size of the light spots on the light-sensitive layer;

the near-field optical means being adapted to reduce the size of the light spots in at least one direction to values smaller than the wavelength of the laser radiation;

a movement unit for generating relative movement between the optical beam guidance means of the exposure unit and the mounting device; and a control for controlling the intensity and position of the light spot on the light-sensitive layer of the substrate;

wherein:

the entire light spot pattern and the mounting device are movable relative to one another in an exposure movement direction and the light spots of the light spot pattern are thereby activatable or deactivatable in accordance with the shape of the sections to be exposed.

* * * * *